United States Patent [19]
Carter et al.

[11] Patent Number: 6,077,308
[45] Date of Patent: *Jun. 20, 2000

[54] CREATING LAYOUT FOR INTEGRATED CIRCUIT STRUCTURES

[75] Inventors: Craig A. Carter, Boise; John D. Mosby, Eagle, both of Id.

[73] Assignee: Micron Technology, Inc., Boise, Id.

[*] Notice: This patent issued on a continued prosecution application filed under 37 CFR 1.53(d), and is subject to the twenty year patent term provisions of 35 U.S.C. 154(a)(2).

[21] Appl. No.: 08/915,849

[22] Filed: Aug. 21, 1997

[51] Int. Cl.$^7$ ............................................. G06F 17/50

[52] U.S. Cl. ................................. 716/8; 716/11; 716/18

[58] Field of Search ................................. 364/489, 490, 364/491; 716/1, 2, 8, 10, 11, 18

[56] References Cited

U.S. PATENT DOCUMENTS

| | | | |
|---|---|---|---|
| 4,319,396 | 3/1982 | Law et al. | 29/571 |
| 5,416,722 | 5/1995 | Edwards | 364/491 |
| 5,633,807 | 5/1997 | Fishburn et al. | 364/491 |
| 5,764,533 | 6/1998 | DeDood | 364/491 |
| 5,790,414 | 8/1998 | Okano et al. | 364/488 |

OTHER PUBLICATIONS

Jankovic et al. "Transforming IC Layout Description from the Unrestricted to a Restricted Format," IEEE, Proc. 21st International Conference on Microelectronics, p733–735, Sep. 1996.

Mathias et al. "FLAG: A Flexible Layout Generator for Analog MOS Transistors," IEEE Journal of Solid-State Circuits, vol. 33, No. 6, p. 896–903, Jun. 1998.

Conn et al. "Optimization of Custom MOS Circuits by Transistor Sizing," 1996 IEEE/ACM Conference on Computer–Aided Design, Nov. 10–14, 1996, p.174–180, Nov. 1996.

Gupta et al. "XPRESS: A Cell Layout Generator with Integrated Transistor Folding," 1998 IEEE/ACM Conference on Computer–Aided Design, Nov. 8–12, 1998, p.128–135.

*Primary Examiner*—Paul R. Lintz
*Assistant Examiner*—Leigh Marie Garbowski
*Attorney, Agent, or Firm*—Schwegman, Lundberg, Woessner & Kluth, P.A.

[57] ABSTRACT

A method and system for constructing polygon layout. From a schematic, there is a data file describing a series-parallel transistor structure having a plurality of gate regions and a plurality of source/drain regions. A representation list is created (either by a computer user or by a computer analyzing a netlist). This representation list includes a plurality of region data for the plurality of gate regions and the plurality of source/drain regions. Polygon layout is built for the series-parallel transistor structure from this representation list.

25 Claims, 8 Drawing Sheets

510→ SOURCE/DRAIN OBJECT 1

| VIAS | F |
|---|---|
| CONTACT | T |
| NET | NETY |

520→ GATE OBJECT 2

| WIDTH | 20 |
|---|---|
| LENGTH | 1 |
| NET | NETC |

530→ SOURCE/DRAIN OBJECT 3

| VIAS | T |
|---|---|
| CONTACT | T |
| NET | VSS |

540→ GATE OBJECT 4

| WIDTH | 20 |
|---|---|
| LENGTH | 1 |
| NET | NETB |

550→ SOURCE/DRAIN OBJECT 5

| VIAS | F |
|---|---|
| CONTACT | F |
| NET | NET1 |

560→ GATE OBJECT 6

| WIDTH | 20 |
|---|---|
| LENGTH | 1 |
| NET | NETA |

570→ SOURCE/DRAIN OBJECT 7

| VIAS | F |
|---|---|
| CONTACT | T |
| NET | NETY |

CREATING LAYOUT FOR INTEGRATED CIRCUIT STRUCTURES

FIELD OF THE INVENTION

The present invention relates to the computerized design of integrated circuits and in particular to the automated layout of the circuit's polygon regions.

BACKGROUND OF THE INVENTION

Computer-aided engineering (CAE) technology includes software tools that assist in the design and layout of the masks used in the production of integrated circuit chips (ICs) by photolithography. Chip design may begin with the creation of a schematic using a CAE drafting tool. This schematic is then translated into a netlist—a text file that describes all of the schematic's instances and their interconnecting nets.

The netlist can be used for several purposes. It may be input to a computerized simulator or verifier to test the circuit before its hardware implementation. Or the netlist can be input to a layout synthesis program. A layout synthesizer converts the netlist into a geometric circuit description by determining a "good" placement of the circuit's polygon regions by analyzing the connectivity and physical placement of the instances and their elementary regions. The synthesizer determines whether a group of transistors within the circuit can share source/drain regions. Another function of a synthesizer is to determine whether a transistor with a wide gate should be folded into a series of shorter gates having common source/drain regions.

After synthesizing the circuit design, a compactor can be used to produce the final layout of the regions. The compactor follows the set of design rules while determining the physical location of the source/drain, gate, and contact positions.

What is needed in the art is a CAE tool, to be called a "device generator". The device generator should be able to represent circuit devices as objects using an advanced symbolic device layout representation so that the devices (such as transistors, capacitors, and resistors) could be more readily manipulated. Modeling devices as objects in such a fashion could assist the synthesizer in placing complex series-parallel transistor structures. This would result in layout which is more compact than using individual transistors. Such a device generator would be used to construct layout for the integrated circuit transistor structures upon command from either the synthesizer or engineer and would write out the resulting layout of the polygon regions to the appropriate layout database directly as opposed to relying on the compactor to subsequently perform the layout. Unlike a compactor, which places all of the device regions at a single time, what is needed is a device generator allowing placement to be done repetitively. During the layout synthesis process, each portion of the circuit could be separately placed. This would allow the layout synthesizer to rely on a previously placed portion of the circuit for its remaining placement.

This device generator would need to follow design rules and be able to control gate widths and lengths while still allowing for merging of active area regions between transistor gates. It should give a fast response to the layout creation process and be able to regenerate portions of the layout upon command.

SUMMARY OF THE INVENTION

A method and system for constructing polygon layout. From a schematic, there is a data file describing a series-parallel transistor structure having a plurality of gate regions and a plurality of source/drain regions. A representation list is created (either by a computer user or by a computer analyzing a netlist). This representation list includes a plurality of region data for the plurality of gate regions and the plurality of source/drain regions. Polygon layout is built for the series-parallel transistor structure from this representation list.

BRIEF DESCRIPTION OF THE DRAWINGS

In the drawings, where like numerals refer to like components throughout the several views.

FIG. 5 is a graphical diagram of data passed to device generator for seven sample objects to be placed;

DETAILED DESCRIPTION OF THE PREFERRED EMBODIMENTS

In the following Detailed Description, reference is made to the accompanying drawings which form a part hereof and in which is shown by way of illustration specific embodiments in which the invention may be practiced. These embodiments are described in sufficient detail to enable those skilled in the art to practice and to use the invention, and it is to be understood that other embodiments may be utilized and that changes may be made without departing from the spirit and scope of the present invention. The following Detailed Description is, therefore, not to be taken in a limiting sense and the scope of the invention is defined by the appended claims. In the figures, elements having the same number perform essentially the same functions.

Figure 1:
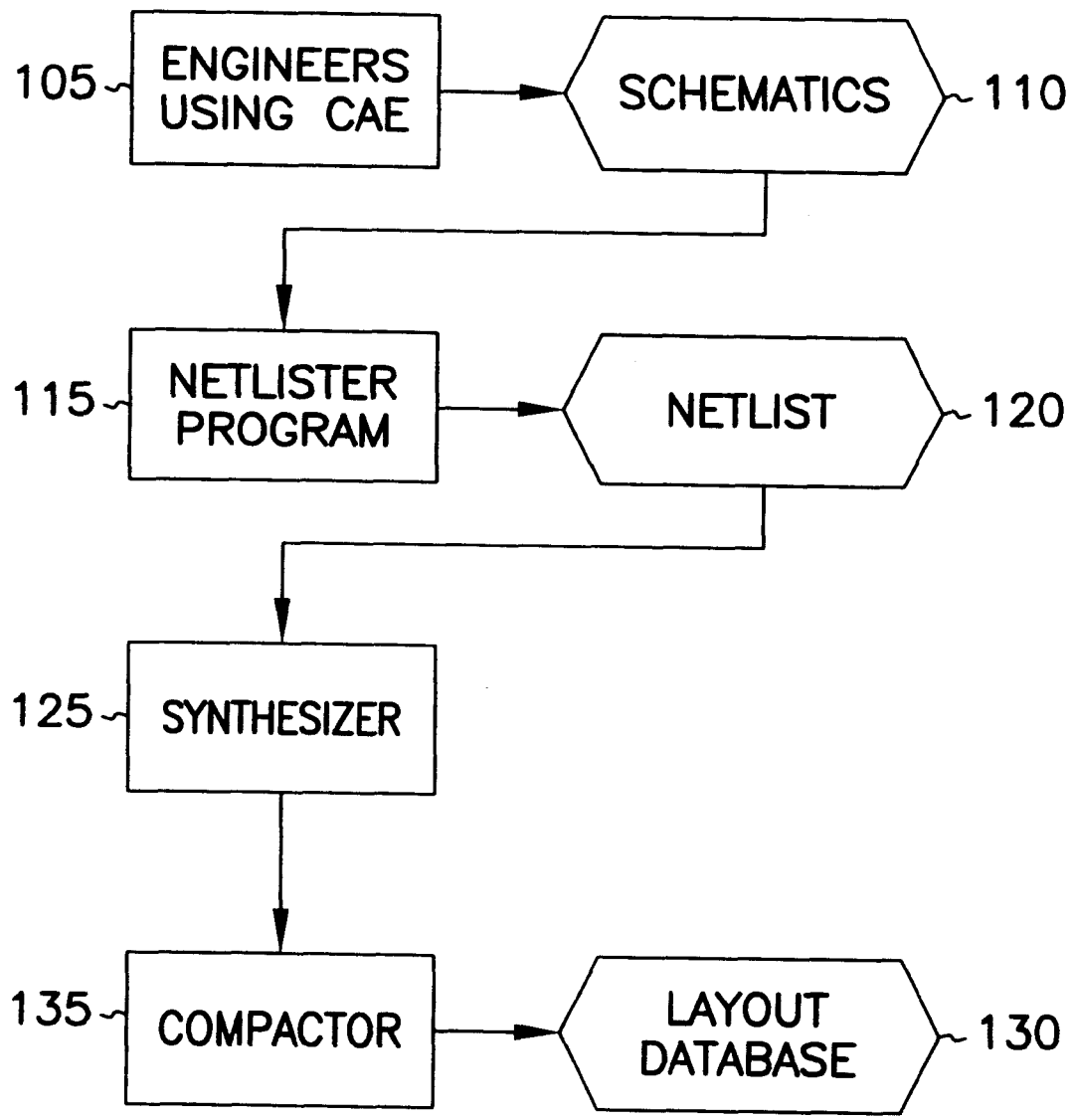
FIG. 1 is a block diagram of the circuit design process.

Referring to FIG. 1, one general procedure for integrated circuit (IC) design includes engineers 105, netlister program 115, synthesizer program 125, and compactor 135. These human and automated tools result in the production of schematics 110, netlist file 120, and layout database 130. In the IC design procedure, engineers 105 use computer-aided engineering (CAE) software tools to graphically diagram the circuits as a schematic 110. Schematics 110 consists of instance symbols connected by nets. Such schematics can serve as input to netlister program 115, which converts the graphical schematic to a textual description. This textual description is netlist 120 and comprises a description for each of the instances found within schematic 110.

Once netlist 120 is produced, it may be passed to synthesizer 125. Synthesizer 125 analyzes the connectivity of the circuit. Synthesizer 125 passes its results to compactor 135, which follows design rules to integrate the polygon regions of the transistors that make up the circuit and to place the regions within the restrictions of the design rules. Unfortunately, historically, compactor 135 does not integrate well with synthesizer 125. Without a strong interaction between compactor 135 and synthesizer 125, compactor 135 constructs the entire layout database 130 for the circuit without relying on much data already previously, acquired or calculated by synthesizer 125.

Figure 2:
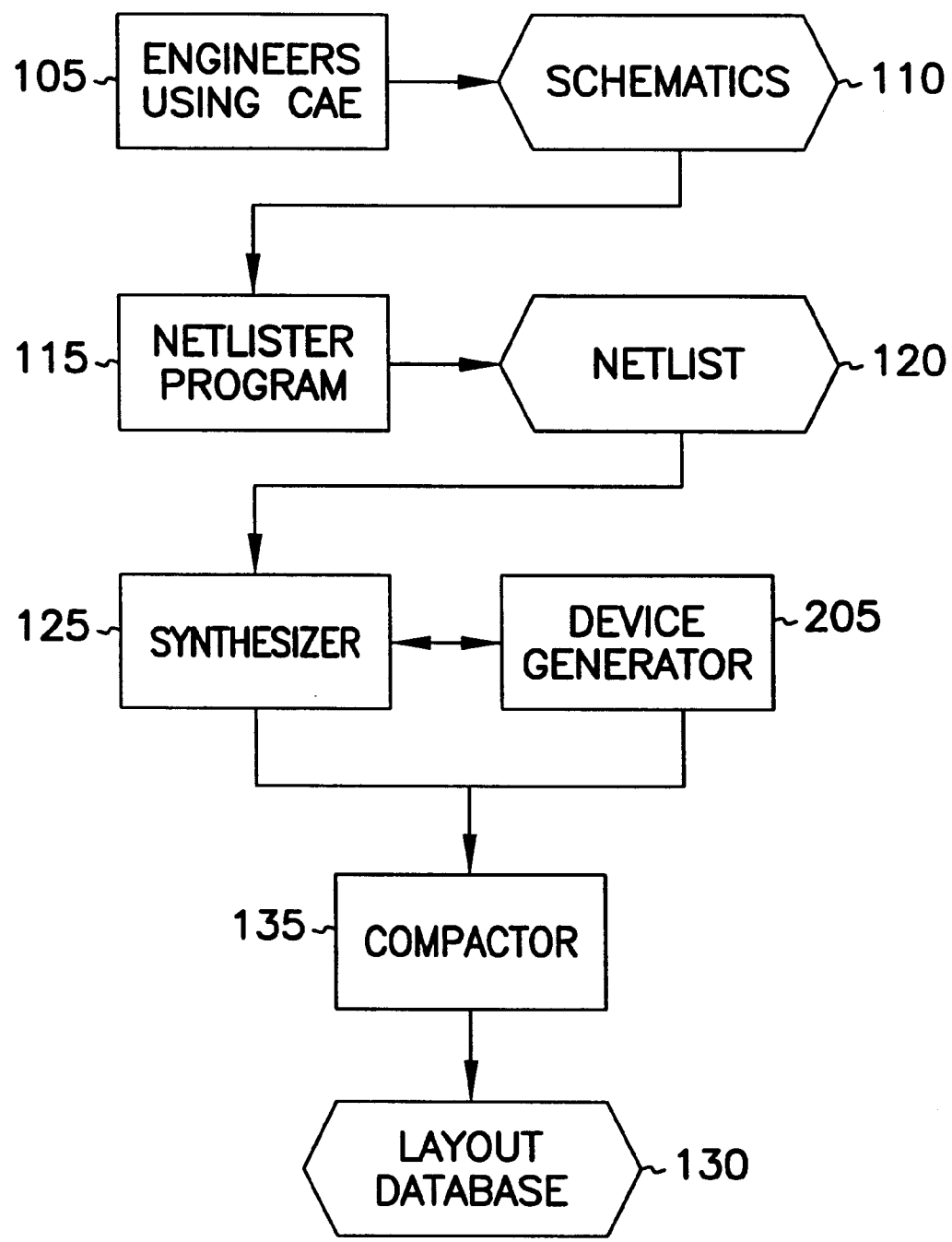
FIG. 2 is a block diagram of the circuit design process utilizing a device generator to generate the placement of the polygon regions.

The present invention, which in one embodiment, is a device generator 205, is shown in FIG. 2 as an additional element to the IC design procedure. Device generator 205 can be integrated with synthesizer 125. Device generator 205 constructs polygon layout for the series-parallel transistor structures found within the integrated circuit design. Device generator 205 creates this polygon layout by treating the devices' polygon regions as objects. For example, a transistor's source, gate and drain regions are each manipulated by device generator 205 as individual objects. Device generator 205 produces the initial layout placement of source, gate and drain regions before, or even instead of, having the compactor 135 place the devices. This resulting layout can be used to construct complex series-parallel gates with varying widths and lengths for each gate.

Figure 3:
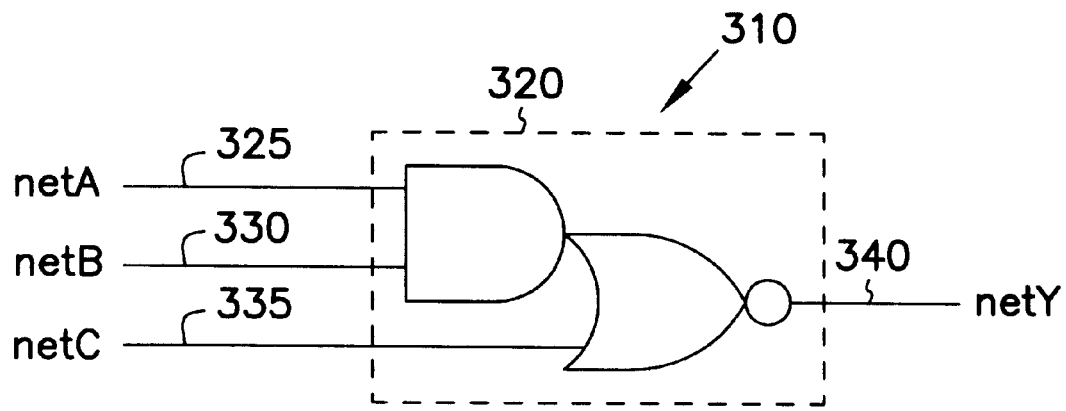
FIG. 3 is a schematic consisting of an AOI (And-OR-Invert) gate.

An example of how the polygon regions are placed by device generator 205 begins by referring to FIG. 3. FIG. 3 is a simple schematic 310 consisting of an AOI (And Or Invert) gate 320. The AOI gate 320 has inputs of netA 325 and netB 330 and netC 335. The output of AOI gate 320 is netY 340.

Figure 4:
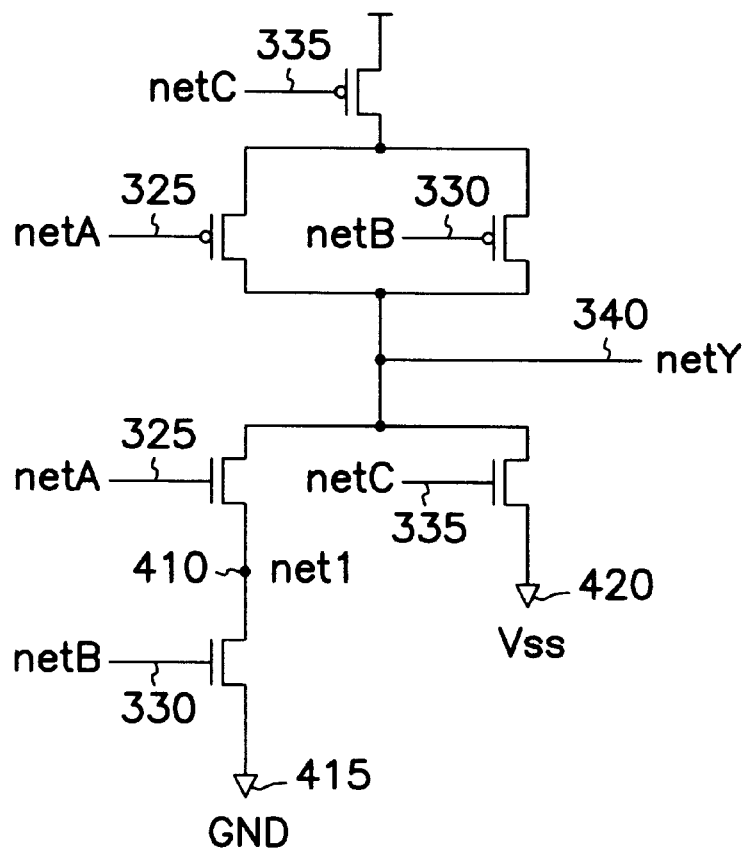
FIG. 4 is a transistor-level diagram of the AOI gate of FIG. 3.

FIG. 4 is a transistor-level diagram of the combination AOI gate 320 from FIG. 3. FIG. 4 includes netA 325, netB 330, netC 335 and netY 340, as well as net1 410, a net for ground 415 and a net for Vss 420.

During circuit design, the schematic of FIG. 3 is converted to a netlist 120 by netlister program 115. The netlist 120 details the interconnects of the transistors and nets shown in FIG. 4. After the netlist 120 for these two instances is created, a synthesizer 125 would be used to analyze the circuit's connectivity and estimate the physical characteristics of its transistors and other devices. The information calculated by synthesizer 125 is valuable to device placement. Therefore, in the present invention, synthesizer 125 calls on the device generator 205, passing to it this information, to place the objects within the circuit.

In order to accomplish effective placement of the objects, device generator 205 utilizes an advanced symbolic representation. The advanced symbolic representation is a model that includes detail of the object to the level of individual gate, source and drain regions of the transistors as well as similar structures for other devices, such as resistors and capacitors. This advanced symbolic device layout representation is important to the effectiveness of the device generator 205 and is a different approach than is used by other circuit design systems.

Advanced Symbolic Representation of Devices

The advanced symbolic representation supported by device generator 205 provides a detailed model of the device structures of the circuit and allows the polygon regions of the devices to be strategically placed in their optimal locations. The four primary figures of merit for evaluating object placement are:

(1) area,
(2) wire length,
(3) wiring density, and
(4) capacitance due to transistor active area.

Area is measured by the width of a linear arrangement of p-channel or n-channel transistors. Wire length is measured by the length of separation between electrically-equivalent transistor terminals (i.e., terminals connected to a common net). Wiring density is determined by the size of the central interconnection channel separating the row of p-channel transistors from its dual row of n-channel transistors.

By using the advanced symbolic representation of the devices in the circuit, device generator 205 finds and creates opportunities for source/drain region sharing. Such region sharing is valid when two adjacent regions are connected to the same logical net (i.e., are electrically equivalent in the circuit). When this opportunity arises, the normal spacing required by the design rules between the regions, as well as the capacitance due to the active area used by the regions, can be eliminated. The placement by device generator 205 in such cases results in a denser circuit layout having better performance.

This process of region sharing is complicated by the necessity for folding transistors to meet cell height constraints. The advanced symbolic representation implemented by device generator 205 allows the synthesizer to easily fold the necessary transistor regions.

Symbolic representation is not a new procedure. However, current methods of symbolic representation for placing transistors, provide a very coarse-level of detail. Such a coarse representation of the layout does not track the individual device structures (e.g., source, gate, and drain regions). After roughly defining this symbolic representation, the compaction program 135 is needed to actually place the devices. The compactor 135 attempts to optimize the symbolic transistor placement by removing unnecessary empty space in the layout, and discovering situations where source/drain regions can be shared.

Prevailing methods of coarse symbolic representation do not assist in folding transistors that must be folded due to their sizes and cell height constraints. Instead, a post-placement step generates the required symbolic device geometry prior to compaction. Or, in some systems, the folding is accomplished as an integrated step with the compaction. In either case, due to the coarseness of the traditional symbolic layout representation, the synthesizer 125 is unable to assess the effects of actual device geometry (such as that necessitated by transistor folding) when constructing the placement, and a large subset of feasible solutions are excluded from its consideration.

Leaving the task of transistor folding and source/drain region sharing to the post-processor or compactor 135 is a poor alternative to using the device generator 205 of the present invention. There are structural aspects of all devices that are very significant for discovering source/drain region sharing and to the evaluation of space tradeoffs in transistor folding that are easily captured by the advanced symbolic representation provided by device generator 205. These structural aspects are very difficult to reconstruct from polygon layout itself.

By integrating synthesizer 125 with device generator 205 and implementing the advanced symbolic representation of the circuit, the synthesizer 125 has access to enough layout information to allow the layout compaction phase to be integrated with the layout synthesis phase. Combining these two phases is a powerful method for producing area and optimal cell layout while avoiding the enormous space requirements associated with representing layout at the polygon level.

The advanced symbolic representation supported by device generator 205 provides the following three advantages over current symbolic representation schemes:

(1) Detailed device layout information can be efficiently created and manipulated earlier in the synthesis process;

(2) Control is available over transistor creation down to a single source/drain or gate region without going all the way to the polygon level; and (3) Transistor gates of different sizes can be folded and their associated source-drain regions can be merged.

FIG. 5 begins to show how device generator 205 uses advanced a symbolic device representation. FIG. 5 is a graphical representation of the seven groups of object information relating to schematic 310 from FIG. 3 which are passed between synthesizer 125 (or from a computer user directly) and device generator 205. The seven objects, called a representation list, which are stored as a data file and which represent the seven objects necessary to layout the schematic 310 are:

source/drain object 1 510, gate object 2 520, source/drain object 3 530, gate object 4 540, source/drain object 5 550, gate object 6 560, and source/drain object 7 570.

Source/drain objects 1, 3, 5, and 7 (510, 530, 550, and 570), have region data concerning the region's connectivity, physical characteristics and electrical characteristics. For example, region data includes information indicating whether a via is present, whether a contact is present, and the name of the object's associated net. Gate objects 2, 4, and 6 (520, 540, and 560), have region data representing the width of the gate, the length of the gate, and the name of the gate's associated net.

Figure 6:
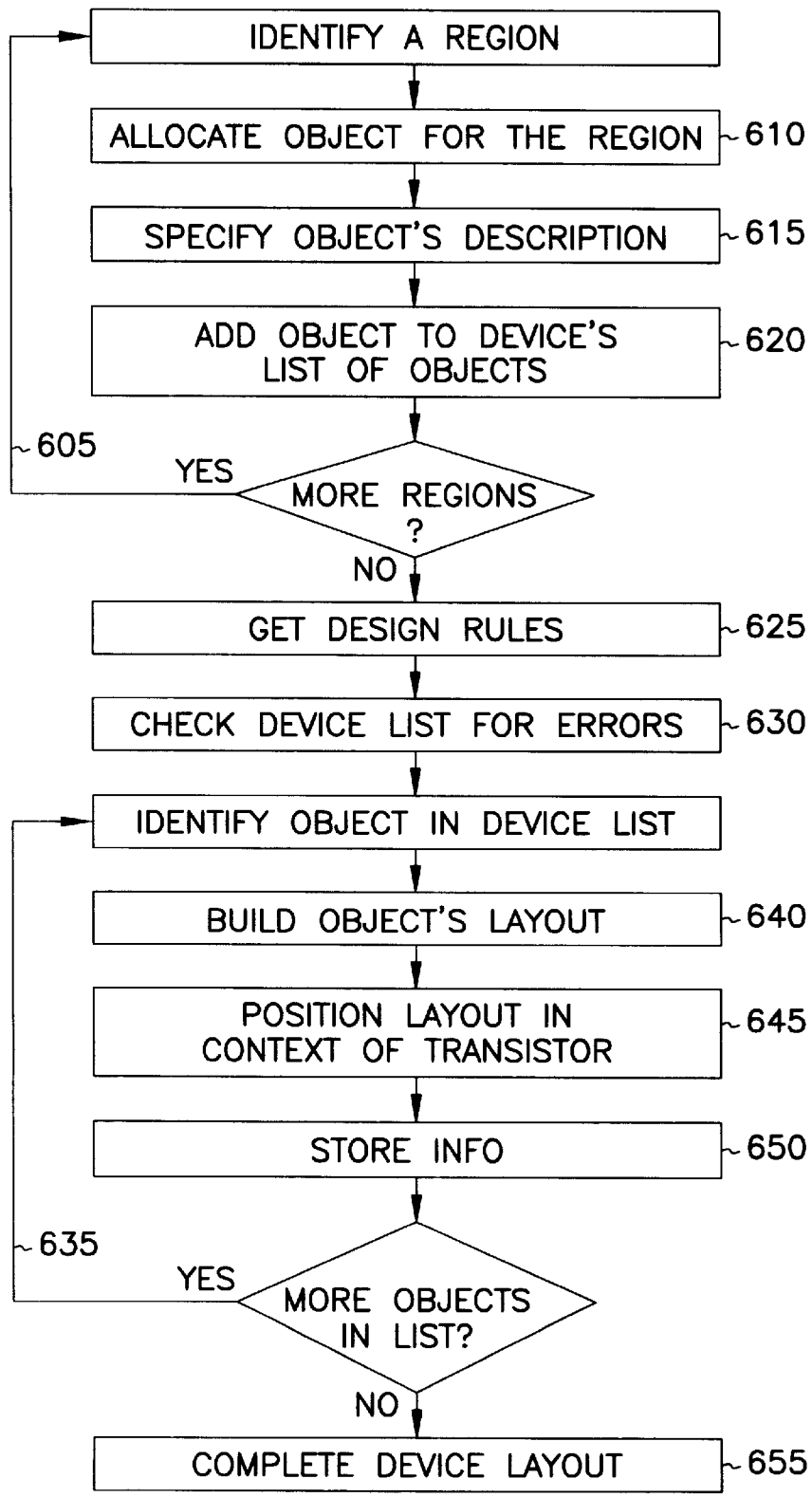
FIG. 6 is a flowchart of one embodiment of the device generator.

Table 1 (below) corresponds to a flowchart of one embodiment of device generator 205, provided as FIG. 6. This flowchart includes the steps performed by device generator 205 to place the device regions of a schematic by using the representation list information input from the objects of FIG. 5. A corresponding pseudo-code listing (Table 1) of one embodiment of the flowchart of FIG. 6 is below:

TABLE 1

Pseudo-code of One Embodiment of Device Generator

```
05   for each (source or drain or gate region)       ;; step 605
10   {
15      device = dg_new("sd1")                        ;; step 610
20      dg_set(device, "connect", "INSIDE")           ;; step 615
25      dg_set(device, "stub", "LEFT");
30      dg_set(device, "drawcon", "TRUE");
35      dg_set(device, "drawvias", "TRUE");
40      dg_append_to_device_list(devlist, device)    ;; step 620
45   }
50   device = dg_new("tran");
55   dg_set(device, "ttype", "P");
60   dg_set(device, "route", "ALL");
65   dg_set(device, "convia_ratio", "4");
70   dg_set(device, "con_coverage", "0.66");
75   dg_set(device, "draw_nwell", "TRUE");
80   ((dg_tran_desc *)device -> desc) -> devlist = devlist;
85                           ;; ready to build the device
90   R = tm_alloc_and_init_rules()                    ;; step 625
95   dg_tran_desc *desc = (dg_tran_desc *)device-> desc
100     if (! dg_check_tran(desc)) return NULL;       ;; step 630
105     for each (object in device list)              ;; step 635
110     {
115        build layout                                ;; step 640
```

TABLE 1-continued

Pseudo-code of One Embodiment of Device Generator

```
120        position the layout in context of the transistor ;; step 645
125        store info to complete transistor              ;; step 650
130     }
135  complete the device layout                          ;; step 655
```

The first phase of device generation consists of processing each region of the circuit (loop 605). For each region, the device generator 205 constructs a list of source/drain and gate device descriptions. These descriptions are data structures used by the device generator 205. Typically, the device generator 205 will already have the information it needs in some data structure internal to the synthesizer 125. This information is used to construct the data structures needed by the device generator. At step 610, an object is allocated for the current region. The allocated object is either a source/drain object or a gate object. In pseudo-code, this step is accomplished in line 15 of Table 1 by the dg_new function.

Once allocated, the appropriate arguments are accepted as input at step 615. If the current object is a source/drain region, then the via, contact and net information are input. Alternatively, if the current object is a gate region, then the width, length and net name are input. This specification step is accomplished in pseudo-code at lines 20 through 35. Each object is then (at step 620 and line 40) added to the device listing. This device listing tracks all of the devices which are to be placed. The device generator 205 uses the variable devlist to create an internal list, used to store detailed information of the source/drain and gate regions, such as coordinates of routing connection points, positions of contacts, etc.

When the internal list is created, the device generator 205 calculates the relative placement locations for the objects. Device generator 205 does this by looking at two regions to the left of the current regions and two regions to the right of the current region to determine what the geometry for the current region should look like. Also, if the original description contained consecutive gate regions (for series gates), extra "dummy" source/drain regions are added to the internal description to represent the area between the gates.

Lines 50 through 80 allocate and set up the transistor device object itself in much the same way that lines 15 through 40 set up the source/drain regions. Once allocated by the dg_new command in line 50, the transistor object's parameters are specified. For example, line 55 sets the device to be a p-type transistor. Line 80 add the list of source/drain and gate devices as one of the characteristics of the transistor.

Once all objects have been allocated and specified, and the device listing has been generated, device generator 205 loads the design rules, at step 625, and checks (at step 630) the device list against these rules for errors. The pseudo-code shown in Listing A accomplishes this in lines 90 through 100.

Device generator 205 then builds the objects held in the variable devlist. Building comprises three procedures. First, at step 640, the object's layout is determined. Second, at step 645, the position of the layout is determined. Third, at step 650, the transistor's information is stored to layout database 130. This information stored by device generator 205 includes the x-y coordinates representing the polygons.

During the first step of building the objects, the basic transistor layout must be determined from the devlist. At this step, no geometry is built, but data is stored in the internal region list. Such data includes that needed for routing, including the bottom and top connection point for source/drain and gate regions.

Then source/drain and gate regions are routed. The source/drain regions are routed first, before the gate regions so that the gate routing can start on the next outside track after the last source/drain track. Once the source/drain regions have been routed, the gate regions are routed and finally, the source/drain stubs are routed. These are routed last so that they can extend horizontally past gate routing, allowing the source/drain stubs to be connected vertically to the outside of the device.

After routing, the geometry for the basic device layout is done. At this step, the geometry for each of the source/drain and gate regions is built. This includes the contacts and vias for source/drain regions that have them. Also, at this step, the active area polygon for the entire transistor, whose points were stored in a list as each of the individual source/drain regions were built for the entire transistor is built. Then, pins are built so that the next higher level of synthesizer code can find connection points to connect this transistor with others. If the device is an N-type transistor, the device generator 205 mirrors the geometry around the x-axis since all transistors are initially built as though they were P-type transistors. The mirroring is to accommodate the use of the transistors for building a standard cell, where the P- and N-type transistor orientations are mirrored around the x-axis of the cell.

Device generator 205 finalizes the device layout at step 655 by calculating the active area.

Figure 7A:
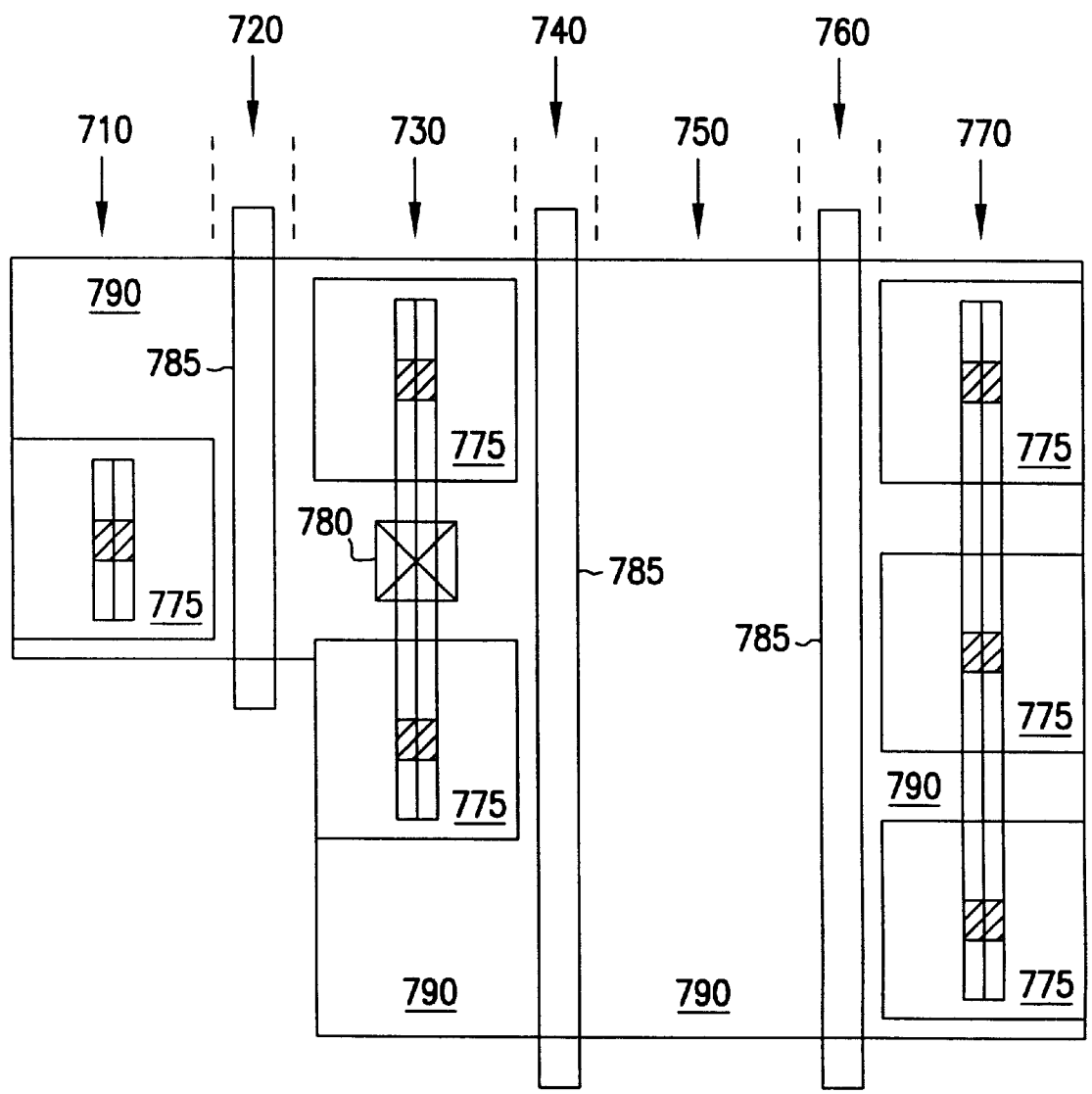
FIG. 7A is a block diagram of the device layout accomplished by device generator.
Figure 7B:
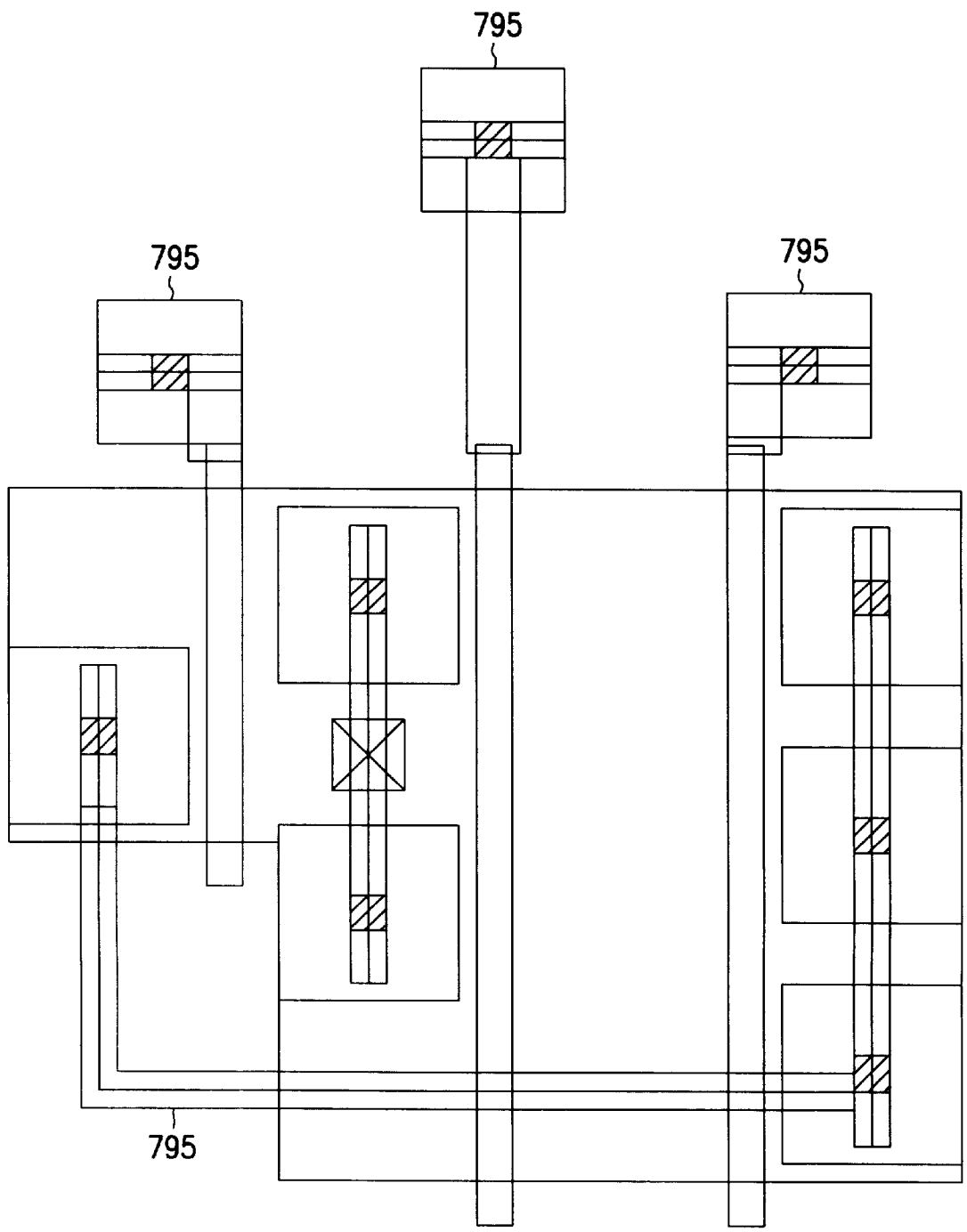
FIG. 7B represents the same layout from device generator with the addition of connection routing.

How device generator 205 works can be illustrated by a simple example. FIG. 7A is a block diagram of the device layout stored in layout database 130 accomplished by device generator 205 in response to the seven input regions from FIG. 5. In acting upon seven input regions 510 through 570, device generator 205 forms seven placed regions 710 through 770. Seven placed regions 710 through 770 are spaced according to design rules and consist of contacts 775, vias 780 and gates 785 separating source/drain areas 790. FIG. 7B represents the same layout from device generator 205 with the addition of connection routing 795.

Figure 8:
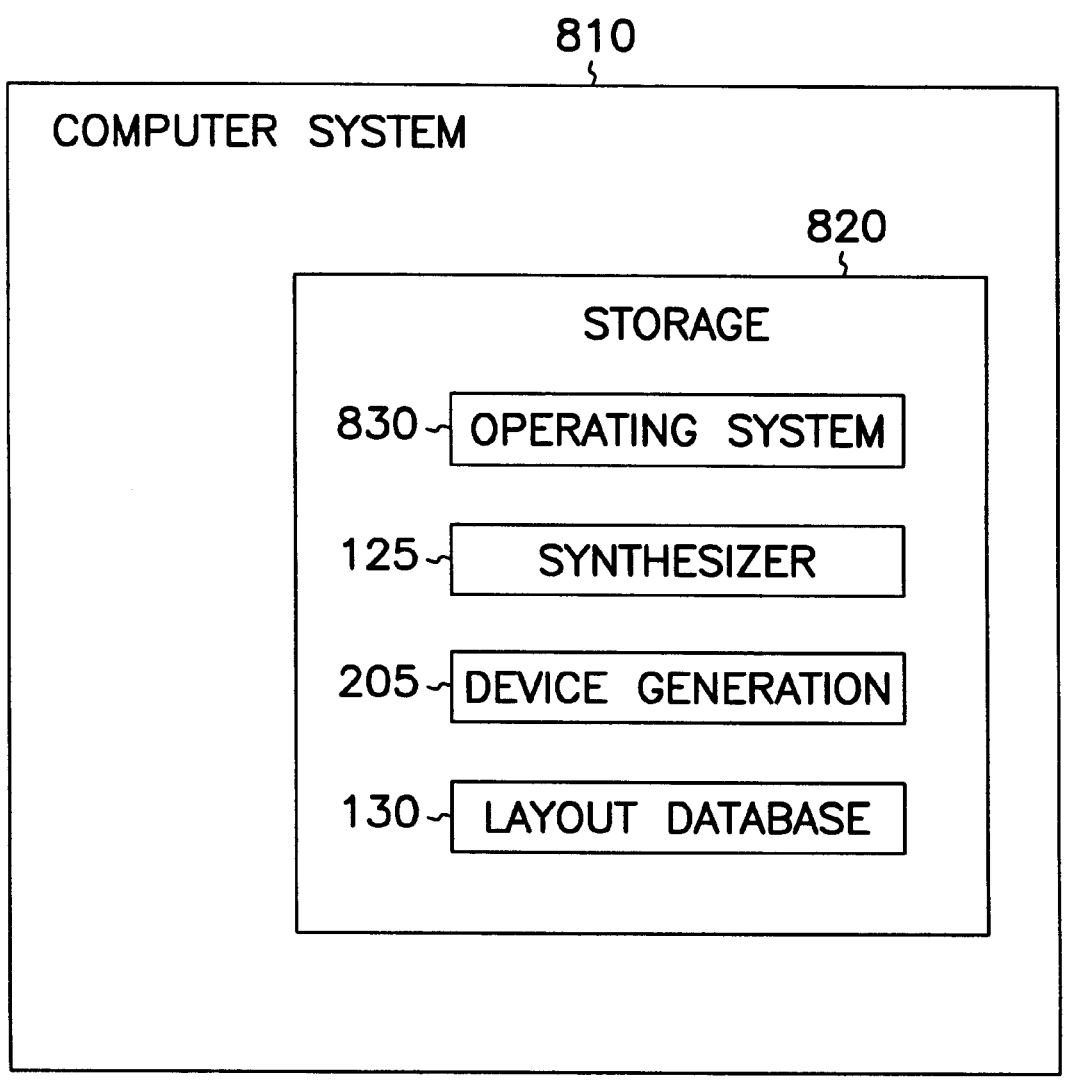
FIG. 8 is a block diagram of a computer system incorporating one embodiment of the device generator.

FIG. 8 is a block diagram of a computer system 810 incorporating one embodiment of the present invention's device generator 205. Computer system 810, which could be a Sun workstation, available from Sun Microsystems of Palo Alto, Calif., or another general purpose computer, is able to process schematics 110 which are in a storage medium 820, such as RAM, a CD, a floppy disk drive, an optical disk, a tape drive, or on the computer's hard drive. Computer system 810 uses an operating system 830 with synthesizer software 125 and device generator software 205 to produce layout database 130. In one embodiment, both synthesizer 125 and device generator 205 are written in the C computer language. In other embodiments, other computer languages can be used to implement device generator 205 and synthesizer 125.

Other embodiments of the present invention are possible without departing from the scope and spirit of the present invention. Other embodiments of this invention include a configuration allowing the device generator 205 to be accessed directly by a computer user. In such an embodiment, the device generator 205 would accept the representation list from the computer user via a keyboard or other device rather than getting the representation list from a file in a storage medium 820.

CONCLUSION

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

We claim:

1. A computer readable medium having computer readable instructions for:

creating a schematic for representing a circuit design, wherein the schematic comprises a plurality of instances and a plurality of nets;

translating the schematic into a netlist file, wherein the netlist file is a text file describing each of the plurality of instances;

synthesizing the netlist file, wherein synthesizing comprises analyzing the connectivity of the plurality of instances by the plurality of nets, and choosing a first plurality of objects to place, wherein the first plurality of objects comprise a plurality of gate regions and a plurality of source/drain regions;

determining relative placement locations for the first plurality of objects, wherein relative placement means the placement in relation to the rest of the first plurality of objects;

determining a second plurality of objects from the first plurality of objects, wherein the second plurality of objects can be merged into a series-parallel transistor structure;

building a polygon layout for the series-parallel transistor structure representing the second plurality of objects, wherein building comprises creating a representation list for the plurality of gate regions and the plurality of source/drain regions from the second plurality of objects, wherein the representation list includes a plurality of region data individually describing the plurality of source/drain regions and the plurality of gate regions, and constructing a polygon for the series-parallel transistor structure from the representation list based on the plurality of region data; and storing the polygon layout to a layout database in a memory.

2. The computer readable medium, as recited in claim 1, having further instructions that, when executed, cause the computer to create the representation list at least in part by creating the plurality of region data comprising region connectivity data, physical characteristics data, and electrical characteristics data.

3. The computer readable medium, as recited in claim 1, having further instructions that, when executed, cause the computer to build the polygon layout according to a plurality of design rules.

4. The computer readable medium, as recited in claim 1, having further instructions that, when executed, cause the computer to create the representation list from analysis of a netlist.

5. The computer readable medium, as recited in claim 1, having further instructions that, when executed, cause the computer to create the representation list at least in part by accepting data from a computer user.

6. A method for designing an integrated circuit, the method comprising:

creating a schematic for representing a circuit design, wherein the schematic comprises a plurality of instances and a plurality of nets;

translating the schematic into a netlist file, wherein the netlist file is a text file describing each of the plurality of instances;

synthesizing the netlist file, wherein synthesizing comprises
analyzing the connectivity of the plurality of instances by the plurality of nets, and
choosing a first plurality of objects to place, wherein the first plurality of objects comprise a plurality of gate regions and a plurality of source/drain regions;

determining relative placement locations for the first plurality of objects, wherein relative placement means the placement in relation to the rest of the first plurality of objects;

determining a second plurality of objects from the first plurality of objects, wherein the second plurality of objects can be merged into a series-parallel transistor structure;

building a polygon layout for the series-parallel transistor structure representing the second plurality of objects, wherein building comprises
creating a representation list for the plurality of gate regions and the plurality of source/drain regions from the second plurality of objects, wherein the representation list includes a plurality of region data individually describing the plurality of source/drain regions and the plurality of gate regions, and
constructing a polygon for the series-parallel transistor structure from the representation list based on the plurality of region data; and storing the polygon layout to a layout database in a memory.

7. The method, as recited in claim 6, wherein creating a representation list further includes creating the plurality of region data comprising region connectivity data, physical characteristics data, and electrical characteristics data.

8. The method, as recited in claim 6, wherein building observes a plurality of design rules.

9. The method, as recited in claim 6, wherein creating a representation list is performed by a computer system from analysis of a netlist.

10. The method, as recited in claim 6, wherein creating a representation list is performed by a computer system accepting data from a computer user.

11. A computer arrangement configured to:

create a schematic for representing a circuit design, wherein the schematic comprises a plurality of instances and a plurality of nets;

translate the schematic into a netlist file, wherein the netlist file is a text file describing each of the plurality of instances;

synthesize the netlist file, wherein synthesizing comprises
analyzing the connectivity of the plurality of instances by the plurality of nets, and
choosing a first plurality of objects to place, wherein the first plurality of objects comprise a plurality of gate regions and a plurality of source/drain regions;

determine relative placement locations for the first plurality of objects, wherein relative placement means the placement in relation to the rest of the first plurality of objects;

determine a second plurality of objects from the first plurality of objects, wherein the second plurality of objects can be merged into a series-parallel transistor structure;

build a polygon layout for the series-parallel transistor structure representing the second plurality of objects, wherein building comprises
creating a representation list for the plurality of gate regions and the plurality of source/drain regions from the second plurality of objects, wherein the representation list includes a plurality of region data individually describing the plurality of source/drain regions and the plurality of gate regions, and
constructing a polygon for the series-parallel transistor structure from the representation list based on the plurality of region data; and store the polygon layout to a layout database in a memory.

12. The computer arrangement, as recited in claim 11, further configured to create the representation list at least in part by creating the plurality of region data comprising region connectivity data, physical characteristics data, and electrical characteristics data.

13. The computer arrangement, as recited in claim 11, further configured to build the polygon layout according to a plurality of design rules.

14. The computer arrangement, as recited in claim 11, further configured to create the representation list from analysis of a netlist.

15. The computer arrangement, as recited in claim 11, further configured to create the representation list at least in part by accepting data from a computer user.

16. A device generator comprising:
a computer readable medium having computer readable instructions for
creating a schematic for representing a circuit design, wherein the schematic comprises a plurality of instances and a plurality of nets;
translating the schematic into a netlist file, wherein the netlist file is a text file describing each of the plurality of instances;
synthesizing the netlist file, wherein synthesizing comprises
analyzing the connectivity of the plurality of instances by the plurality of nets, and
choosing a first plurality of objects to place, wherein the first plurality of objects comprise a plurality of gate regions and a plurality of source/drain regions;
determining relative placement locations for the first plurality of objects, wherein relative placement means the placement in relation to the rest of the first plurality of objects;
determining a second plurality of objects from the first plurality of objects, wherein the second plurality of objects can be merged into a series-parallel transistor structure;
building a polygon layout for the series-parallel transistor structure representing the second plurality of objects, wherein building comprises
creating a representation list for the plurality of gate regions and the plurality of source/drain regions from the second plurality of objects, wherein the representation list includes a plurality of region data individually describing the plurality of source/drain regions and the plurality of gate regions, and
constructing a polygon for the series-parallel transistor structure from the representation list based on the plurality of region data; and
storing the polygon layout to a layout database in a memory.

17. The device generator, as recited in claim 16, wherein the computer readable medium has further instructions that, when executed, cause the computer to create the representation list at least in part by creating the plurality of region data comprising region connectivity data, physical characteristics data, and electrical characteristics data.

18. The device generator, as recited in claim 16, wherein the computer readable medium has further instructions that, when executed, cause the computer to build the polygon layout according to a plurality of design rules.

19. The device generator, as recited in claim 16, wherein the computer readable medium has further instructions that, when executed, cause the computer to create the representation list from analysis of a netlist.

20. The device generator, as recited in claim 16, wherein the computer readable medium has further instructions that, when executed, cause the computer to create the representation list at least in part by accepting data from a computer user.

21. A device generator comprising:
a computer arrangement configured to
create a schematic for representing a circuit design, wherein the schematic comprises a plurality of instances and a plurality of nets;
translate the schematic into a netlist file, wherein the netlist file is a text file describing each of the plurality of instances;
synthesize the netlist file, wherein synthesizing comprises
analyzing the connectivity of the plurality of instances by the plurality of nets, and
choosing a first plurality of objects to place, wherein the first plurality of objects comprise a plurality of gate regions and a plurality of source/drain regions;
determine relative placement locations for the first plurality of objects, wherein relative placement means the placement in relation to the rest of the first plurality of objects;
determine a second plurality of objects from the first plurality of objects, wherein the second plurality of objects can be merged into a series-parallel transistor structure;
build a polygon layout for the series-parallel transistor structure representing the second plurality of objects, wherein building comprises
creating a representation list for the plurality of gate regions and the plurality of source/drain regions from the second plurality of objects, wherein the representation list includes a plurality of region data individually describing the plurality of source/drain regions and the plurality of gate regions, and
constructing a polygon for the series-parallel transistor structure from the representation list based on the plurality of region data; and
store the polygon layout to a layout database in a memory.

22. The device generator, as recited in claim 21, wherein the computer arrangement is further configured to create the representation list at least in part by creating the plurality of region data comprising region connectivity data, physical characteristics data, and electrical characteristics data.

23. The device generator, as recited in claim 21, wherein the computer arrangement is further configured to build the polygon layout according to a plurality of design rules.

24. The device generator, as recited in claim 21, wherein the computer arrangement is further configured to create the representation list from analysis of a netlist.

25. The device generator, as recited in claim 21, wherein the computer arrangement is further configured to create the representation list at least in part by accepting data from a computer user.

* * * * *